United States Patent
Lee et al.

(10) Patent No.: US 10,074,706 B2
(45) Date of Patent: *Sep. 11, 2018

(54) ORGANIC LIGHT EMITTING DIODE DISPLAY

(71) Applicant: SAMSUNG DISPLAY CO., LTD., Yongin-si, Gyeonggi-Do (KR)

(72) Inventors: Wang Woo Lee, Osan-si (KR); Young Woo Park, Seongnam-si (KR); Se Wan Son, Yongin-si (KR); Min Woo Woo, Bucheon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/484,427

(22) Filed: Apr. 11, 2017

(65) Prior Publication Data

US 2017/0221975 A1    Aug. 3, 2017

Related U.S. Application Data

(62) Division of application No. 14/966,127, filed on Dec. 11, 2015, now Pat. No. 9,620,574.

(30) Foreign Application Priority Data

Mar. 26, 2015  (KR) ........................ 10-2015-0042536

(51) Int. Cl.
*H01L 27/32* (2006.01)
*H01L 27/12* (2006.01)

(52) U.S. Cl.
CPC ........ *H01L 27/3258* (2013.01); *H01L 27/124* (2013.01); *H01L 27/1248* (2013.01);
(Continued)

(58) Field of Classification Search
CPC ............. H01L 27/3241; H01L 27/3244; H01L 27/3248; H01L 27/3258; H01L 27/326;
(Continued)

(56) References Cited

U.S. PATENT DOCUMENTS 7,646,017 B2 * 1/2010 Jung ...................... H01L 27/12
257/59
9,620,574 B2 * 4/2017 Lee ..................... H01L 27/3276
(Continued)

FOREIGN PATENT DOCUMENTS

| KR | 10-2007-0076860 | 7/2007 |
| KR | 10-2011-0130854 | 12/2011 |
| KR | 10-2013-0021037 | 3/2013 |

*Primary Examiner* — Eduardo A Rodela
(74) *Attorney, Agent, or Firm* — F. Chau & Associates, LLC

(57) ABSTRACT

An organic light emitting diode display includes a substrate, a semiconductor disposed on the substrate that includes a channel for each of a plurality of transistors and doping regions formed at both sides of each channel; a gate insulating layer disposed on the semiconductor that includes an insulating layer opening through which the doping regions of two different transistors are exposed; a gate electrode disposed on the gate insulating layer that overlaps each channel; an interlayer insulating layer disposed on the gate electrode that includes a first and second contact holes through which the doping regions exposed within the insulating layer opening are each exposed; and data wirings disposed on the interlayer insulating layer that are each connected to the doping regions. The interlayer insulating layer includes an organic layer, and the first and second contact holes each include a first side wall positioned within the insulating layer opening.

8 Claims, 21 Drawing Sheets

(52) U.S. Cl.
CPC ...... *H01L 27/1255* (2013.01); *H01L 27/3246* (2013.01); *H01L 27/3248* (2013.01); *H01L 27/3262* (2013.01); *H01L 27/3265* (2013.01); *H01L 27/3276* (2013.01); *H01L 2227/323* (2013.01)

(58) Field of Classification Search
CPC ............. H01L 27/3262; H01L 27/3265; H01L 27/3274; H01L 27/3276; G09G 3/3208; G09G 3/3233; G09G 3/3258; G09G 2300/0421; G09G 2300/0426; G09G 2300/043

See application file for complete search history.

(56) References Cited

U.S. PATENT DOCUMENTS

| | | | |
|---|---|---|---|
| 9,897,841 B2* | 2/2018 | Kim | G02F 1/133377 |
| 2007/0097303 A1* | 5/2007 | Sonoda | G02F 1/133345 |
| | | | 349/122 |
| 2008/0018816 A1* | 1/2008 | Hattori | G02F 1/136213 |
| | | | 349/39 |
| 2013/0141316 A1 | 6/2013 | Lee et al. | |
| 2016/0087022 A1* | 3/2016 | Tsai | H01L 27/3276 |
| | | | 257/40 |
| 2016/0133190 A1 | 5/2016 | Kim et al. | |
| 2016/0181341 A1 | 6/2016 | Lee et al. | |
| 2016/0225318 A1 | 8/2016 | Choi | |
| 2016/0284784 A1 | 9/2016 | Lee et al. | |
| 2017/0271421 A1* | 9/2017 | Jinbo | H01L 27/3258 |

* cited by examiner

ORGANIC LIGHT EMITTING DIODE DISPLAY

CROSS-REFERENCE TO RELATED APPLICATIONS

This application is a divisional of U.S. application Ser. No. 14/966,127, filed on Dec. 11, 2015 in the U.S. Patent and Trademark Office, which in turn claims priority under 35 U.S.C. § 119 from, and the benefit of, Korean Patent Application No. 10-2015-0042536, filed in the Korean Intellectual Property Office on Mar. 26, 2015, the contents of which are herein incorporated by reference in their entirety.

BACKGROUND

1. Technical Field

Embodiments of the present disclosure are directed to an organic light emitting diode display.

2. Discussion of the Related Art

An organic light emitting diode display includes two electrodes and an organic emission layer disposed therebetween and forms excitons by combining electrons injected from one electrode with holes injected from another electrode at the organic emission layer, and emits light by allowing the excitons to emit energy.

An organic light emitting diode display includes a plurality of pixels, each including an organic light emitting diode, which is a self-light emitting device, and each provided with a plurality of transistors and storage capacitors for driving the organic light emitting diode. The plurality of transistors include a switching transistor and a driving transistor.

The driving transistor controls a driving current flowing through the organic light emitting diode, stores a data voltage in the storage capacitor connected to a driving gate node of the driving transistor, and maintains the stored data voltage for frame. Therefore, the driving transistor can supply a constant driving current to the organic light emitting diode for 1 frame to emit light.

However, changes in the voltage of a data line or the scan signal of a scan line can affect a voltage of a driving gate node of the driving transistor due to a parasitic capacitance formed between the driving gate node connected to a driving gate electrode of the driving transistor and the data line, or a parasitic capacitance at a portion where the driving gate node of the driving transistor overlaps the scan line. The change in voltage of the driving gate node changes a driving current flowing through the organic light emitting diode, which can cause vertical crosstalk, which can change the luminance.

To prevent this phenomenon, an interval between the data line and the driving gate node can be formed to be as far away as possible, but as resolution increases, a pixel size is reduced and a process design rule may not be continuously reducible due to facility specification limitations and photolithography process capability, so that there may be limitations in minimizing crosstalk.

SUMMARY

Embodiments of the present disclosure can provide an organic light emitting diode display that can minimize crosstalk in a high resolution structure.

An exemplary embodiment of the present disclosure provides an organic light emitting diode display, including: a substrate; a semiconductor disposed on the substrate, wherein the semiconductor includes a channel for each of a plurality of transistors, and doping regions formed at both sides of each channel; a gate insulating layer disposed on the semiconductor that includes an insulating layer opening through which the doping regions of two different transistors of the plurality of transistors are exposed; a gate electrode disposed on the gate insulating layer that overlaps each channel; an interlayer insulating layer disposed on the gate electrode that includes a first contact hole and a second contact hole through which the doping regions exposed within the insulating layer opening are each exposed; and data wirings disposed on the interlayer insulating layer that are connected to the doping regions, wherein the interlayer insulating layer includes an organic layer, and the first contact hole and the second contact hole each include a first side wall positioned within the insulating layer opening.

The first contact hole and second contact hole may further each include a second side wall which coincides with a side wall of the insulating layer opening or is positioned outside the insulating layer opening.

The first side wall may be an end surface of the interlayer insulating layer and the second side wall may be an end surface of the gate insulating layer and the interlayer insulating layer.

Another exemplary embodiment of the present disclosure provides an organic light emitting diode display including: a substrate; a scan line disposed on the substrate that transmits a scan signal; a data line and a driving voltage line that each intersect the scan line and respectively transmit a data voltage and a driving voltage; a switching transistor connected to the scan line and the data line; a driving transistor connected to the switching transistor; a compensation transistor that is connected to a driving drain electrode of the driving transistor and is turned on by the scan signal to compensate for a threshold voltage of the driving transistor; a first data connecting member that connects a compensation drain electrode of the compensation transistor and a driving gate electrode of the driving transistor; and an organic light emitting diode electrically connected to the driving transistor, wherein one end of the first data connecting member is connected to the compensation drain electrode through a first contact hole, a switching source electrode of the switching transistor is connected to the data line through a second contact hole, and a first side wall of each of the first contact hole and the second contact hole is positioned within an insulating layer opening through which the compensation drain electrode and the switching source electrode are simultaneously exposed.

The organic light emitting diode display may further include: a gate insulating layer and an interlayer insulating layer sequentially disposed on the substrate, wherein the first side wall is an end surface of the interlayer insulating layer.

The insulating layer opening may penetrate through the gate insulating layer.

The first contact hole and second contact hole may further include a second side wall defined by end surfaces of the gate insulating layer and interlayer insulating layer.

A second storage electrode may be positioned on the second gate insulating layer that is connected to the driving voltage line and overlaps a first storage electrode, and the gate insulating layer may include a first gate insulating layer and a second gate insulating layer.

The second storage electrode may be positioned on the second gate insulating layer and may have a storage opening through which the second gate insulating layer is exposed and an other end of the first data connecting member may be connected to the driving gate electrode through the storage opening.

The scan line may be disposed between the first gate insulating layer and the second gate insulating layer and the first data connecting member may be disposed on the interlayer insulating layer.

The first data connecting member may be disposed on a same layer as the data line and a driving voltage line.

The first data connecting member may extend in a direction parallel to the data line and may be spaced apart from the data line on a plane.

A driving channel of the driving transistor may be curved on a plane.

The organic light emitting diode may include: a first electrode electrically connected to the driving transistor; an organic emission layer formed on the first electrode; and a second electrode formed on the organic emission layer, wherein the first electrode may be spaced apart from the first data connecting member on a plane.

The organic light emitting diode display may further include: a passivation layer that covers the data line, driving voltage line, and first data connecting member; a pixel defined layer that covers an edge of the first electrode; and an initialization voltage line disposed on the same layer as the first electrode that transmits an initialization voltage to initialize the driving transistor.

Another exemplary embodiment of the present disclosure provides an organic light emitting diode display, including: a substrate; a switching transistor on the substrate connected to a scan line and a data line; a driving transistor connected to the switching transistor; a compensation transistor that is connected to a driving drain electrode of the driving transistor and is turned on by the scan signal to compensate for a threshold voltage of the driving transistor; a first data connecting member that connects a compensation drain electrode of the compensation transistor and a driving gate electrode of the driving transistor; and a gate insulating layer and an interlayer insulating layer sequentially disposed on the substrate to cover the switching transistor and the compensation transistor. One end of the first data connecting member is connected to the compensation drain electrode through a first contact hole, a switching source electrode of the switching transistor is connected to the data line through a second contact hole, a first side wall of each of the first contact hole and the second contact hole is an end surface of the interlayer insulating layer and is positioned within an insulating layer opening through the gate insulating layer through which the compensation drain electrode and the switching source electrode are simultaneously exposed, and the first contact hole and second contact hole further include a second side wall defined by end surfaces of the gate insulating layer and interlayer insulating layer.

The scan line may be disposed on the substrate and transmits a scan signal; and the data line may intersect the scan line and transmits a data voltage. The organic light emitting diode display may further include a driving voltage line that intersects the scan line and transmits a driving voltage, and an organic light emitting diode electrically connected to the driving transistor.

The organic light emitting diode display may further include a second storage electrode positioned on the gate insulating layer that is connected to the driving voltage line and overlaps a first storage electrode. The gate insulating layer may include a first gate insulating layer and a second gate insulating layer, the second storage electrode may be positioned on the second gate insulating layer and may have a storage opening through which the second gate insulating layer is exposed, an other end of the first data connecting member may be connected to the driving gate electrode through the storage opening, the scan line may be disposed between the first gate insulating layer and the second gate insulating layer, and the first data connecting member may be disposed on the interlayer insulating layer.

The organic light emitting diode may further include a first electrode electrically connected to the driving transistor; an organic emission layer formed on the first electrode, and a second electrode formed on the organic emission layer, wherein the first electrode is spaced apart from the first data connecting member on a plane.

The organic light emitting diode display may further include a passivation layer that covers the data line, driving voltage line, and first data connecting member; a pixel defined layer disposed on the passivation layer that covers an edge of the first electrode; and an initialization voltage line disposed on the same layer as the first electrode that transmits an initialization voltage to initialize the driving transistor.

According to an exemplary embodiment of the present disclosure, parasitic capacitance can be minimized by positioning the organic layer between the signal lines on which crosstalk occurs.

Therefore, exemplary embodiments of the present disclosure can minimize crosstalk by minimizing the kickback voltage due to the parasitic capacitance to reduce the driving gate voltage Vg of the driving gate electrode connected to the first data connecting member, which is the driving gate node.

Further, exemplary embodiment of the present disclosure can expand the driving range of the driving gate-source voltage Vgs between the driving gate electrode and the driving source electrode, which are connected to the first data connecting member, by minimizing the kickback voltage due to the parasitic capacitance to increase the data voltage. Therefore, exemplary embodiment of the present disclosure can increase the resolution of an organic light emitting diode display and improve the display quality controlling the gray levels of light emitted from the organic light emitting diode (OLED).

DETAILED DESCRIPTION OF EXEMPLARY EMBODIMENTS

Figure 1:
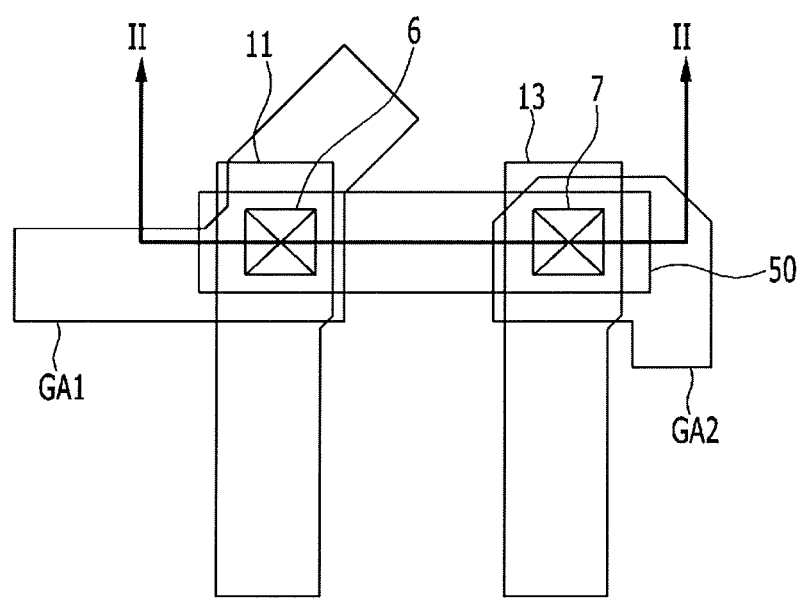
FIG. 1 is an enlarged view of a portion of a contact hole and a signal line formed in an organic light emitting diode display according to an exemplary embodiment of the present disclosure.

Embodiments of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals may designate like elements throughout the specification.

In the drawings, the thickness of layers, regions, etc., may be exaggerated for clarity.

Further, throughout the present specification, it will be understood that when an element such as a layer, film, region, or substrate is referred to as being "on" another element, it can be directly on the other element or intervening elements may also be present.

Further, an active matrix (AM) type organic light emitting diode display having a 7Tr 1Cap structure in which seven thin film transistors (TFTs) and one capacitor are included in one pixel is illustrated in the accompanying drawings, but exemplary embodiments of the present disclosure are not limited thereto.

Figure 2:
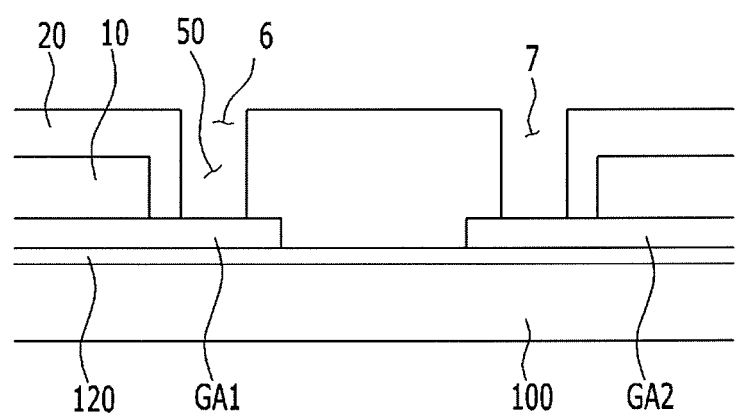
FIG. 2 is a cross-sectional view taken along the line II-II of FIG. 1.
Figure 3:
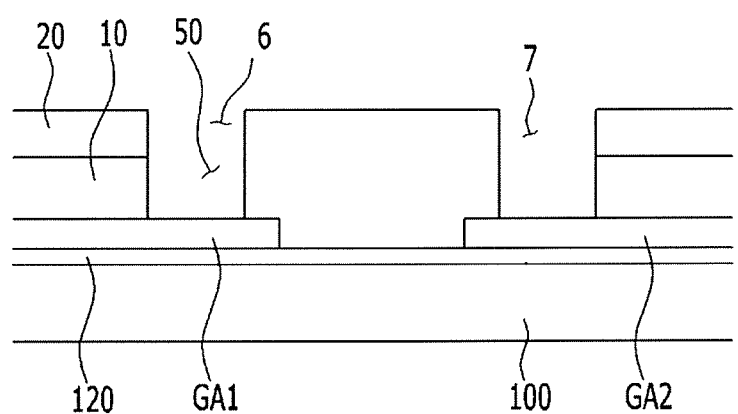
FIG. 3 is a cross-sectional view taken along the line II-II of FIG. 1 as another exemplary embodiment of the present disclosure.

FIG. 1 is an enlarged view of a portion of a contact hole and a signal line formed in a display device according to an exemplary embodiment of the present disclosure, FIG. 2 is a cross-sectional view taken along the line II-II of FIG. 1, and FIG. 3 is a cross-sectional view taken along the line II-II of FIG. 1 as another exemplary embodiment of the present disclosure.

As illustrated in FIGS. 1 and 2, a display device according to an exemplary embodiment of the present disclosure includes a first signal line 11 and a second signal line 13 to which different signals are applied.

The first signal line 11 and the second signal line 13 may be respectively connected to a first semiconductor GA1 and a second semiconductor GA2 on a substrate 100 through contact holes 6 and 7 that penetrate insulating layers 10 and 20. The first and second semiconductors GA1 and GA2 are formed on a different layer from the first and second signal lines 11 and 13. The first and second semiconductors GA1 and GA2 may each include different transistors. A buffer layer 120 can be disposed on the substrate 100 below the first and second semiconductors GA1 and GA2.

The insulating layers 10 and 20 may include a lower insulating layer 10 made of an inorganic layer and an upper insulating layer 20 made of an organic layer, depending on characteristics of each layer.

The insulating layers 10 and 20 include an insulating layer opening 50 formed through the lower insulating layer 10 and the contact holes 6 and 7 formed through the upper insulating layer 20. The shapes and sizes of the insulating layer opening 50 and the contact holes 6 and 7 may be different.

The insulating layer opening 50 exposes both the first semiconductor GA1 and the second semiconductor GA2, and the contact holes 6 and 7 respectively expose the first semiconductor GA1 and the second semiconductor GA2. Boundaries of the contact holes 6 and 7 are positioned within the boundary of the insulating layer opening 50, and therefore the upper insulating layer 20 remains disposed between the contact holes 6 and 7.

FIG. 2 illustrates that the boundaries of the contact holes 6 and 7 are positioned within the insulating layer opening 50, and thus end surfaces of the upper insulating layer 20 forms the side walls of the contact holes 6 and 7, but embodiments are not limited thereto. For example, as illustrated in FIG. 3, the side walls may defined by end surfaces of a stacked structure of the lower and upper insulating layers 10 and 20.

As illustrated in FIG. 3, a portion of the side walls of the contact holes 6 and 7 may coincide with the boundary of the insulating layer opening 50, or may be positioned outside of the boundary of the insulating layer opening 50.

Therefore, a portion of the side wall of the contact hole 6 through which the first semiconductor GA1 is exposed includes end surfaces of both the lower insulating layer 10 and the upper insulating layer 20, and the remainder of the side wall is defined by an end surface of the upper insulating layer 20. Further, a portion of the side wall of the contact hole 7 through which the second semiconductor GA2 is exposed includes end surfaces of both the lower insulating layer 10 and the remainder of the side wall is defined by an end surface of the upper insulating layer 20.

As such, according to an exemplary embodiment of the present disclosure, if a portion of the contact hole is formed within the insulating layer opening, the inorganic lower insulating layer 10 is disposed between the two contact holes, and therefore even though an interval between the two contact holes is reduced, the occurrence of crosstalk due to parasitic capacitance may be minimized.

Hereinafter, an organic light emitting diode display having the above-mentioned contact hole will be described in detail with reference to the accompanying drawings.

Figure 4:
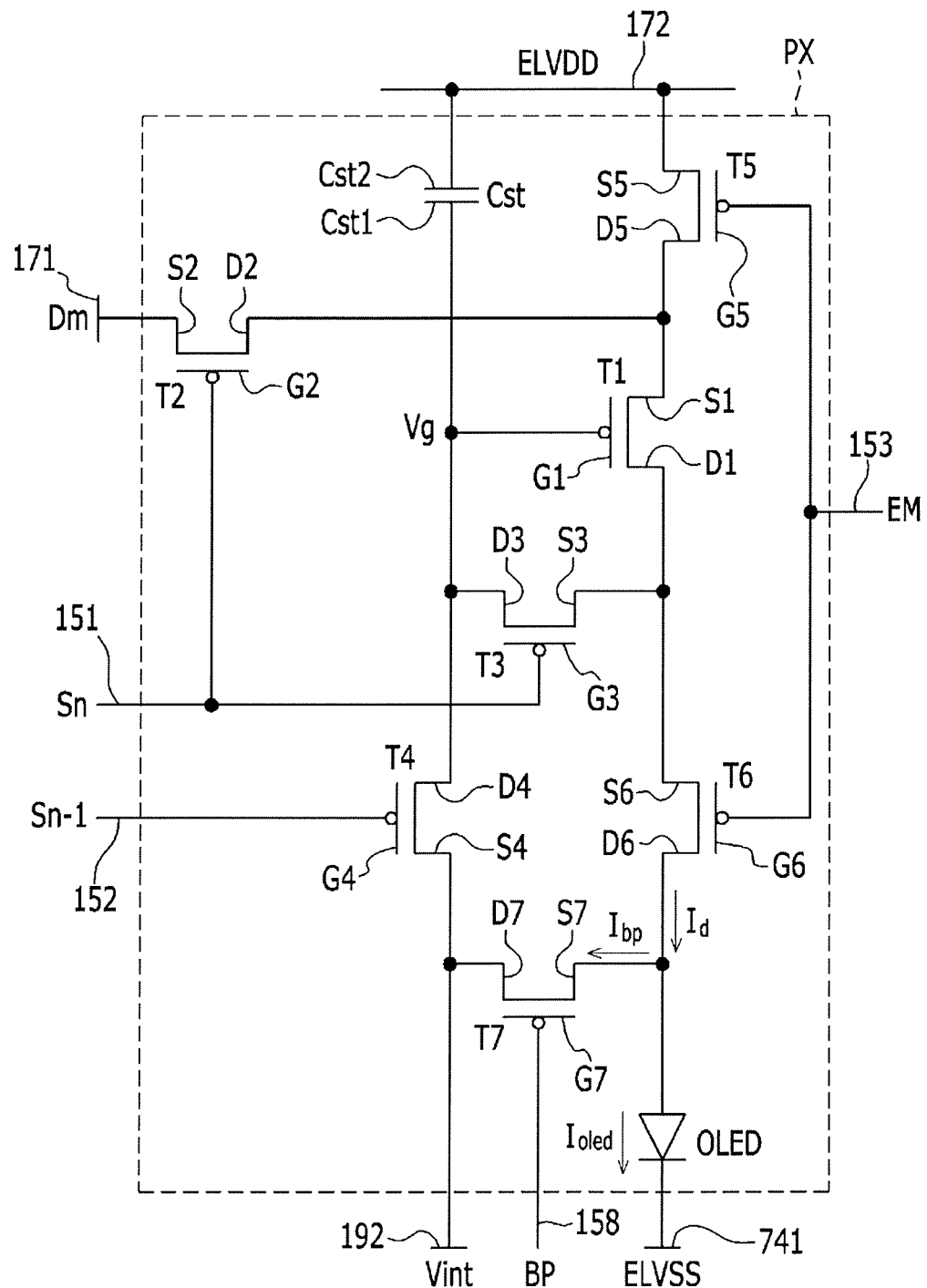
FIG. 4 is an equivalent circuit diagram of one pixel of an organic light emitting diode display according to an exemplary embodiment of the present disclosure.

FIG. 4 is an equivalent circuit diagram of one pixel of an organic light emitting diode display according to an exemplary embodiment of the present disclosure.

As illustrated in FIG. 4, one pixel PX of the organic light emitting diode display according to an exemplary embodiment of the present disclosure includes a plurality of signal lines 151, 152, 153, 158, 171, 172, and 192, a plurality of transistors T1, T2, T3, T4, T5, T6, and T7 connected to the plurality of signal lines 151, 152, 153, 158, 171, 172, and 192, a storage capacitor Cst, and an organic light emitting diode (OLED).

The transistors T1, T2, T3, T4, T5, T6, and T7 include a driving transistor T1, a switching transistor T2, a compensation transistor T3, an initialization transistor 14, an operation control transistor T5, a light emission control transistor T6, and a bypass transistor T7.

The signal lines 151, 152, 153, 158, 171, 172, and 192 include a scan line 151 which transmits a scan signal Sn, a front end scan line 152 which transmits a front end scan signal Sn−1 to the initialization transistor T4, a light emission control line 153 which transmits a light emission control signal EM to the operation control transistor T5 and the light emission control transistor T6, a bypass control line 158 which transmits a bypass signal BP to the bypass transistor T7, a data line 171 which intersects the scan line 151 and transmits a data signal Dm, a driving voltage line 172 which transmits a driving voltage ELVDD and is approximately parallel with the data line 171, and an initialization voltage line 192 which transmits an initialization voltage Vint that initializes the driving transistor T1.

A gate electrode G1 of the driving transistor T1 is connected to a first terminal Cst1 of the storage capacitor Cst, a source electrode S1 of the driving transistor T1 is connected to the driving voltage line 172 via the operation control transistor T5, and a drain electrode D1 of the driving transistor T1 is electrically connected to an anode of the organic light emitting diode (OLED) via the light emission control transistor T6. The driving transistor T1 receives the data signal Dm based on a switching operation of the switching transistor T2 to supply a driving current Id to the organic light emitting diode (OLED).

A gate electrode G2 of the switching transistor T2 is connected to the scan line 151, a source electrode S2 of the switching transistor T2 is connected to the data line 171, a drain electrode D2 of the switching transistor T2 is connected to the driving voltage line 172 via the operation control transistor T5, while being connected to the source electrode S1 of the driving transistor T1. The switching transistor T2 can be turned on by the scan signal Sn received from the scan line 151 to perform a switching operation that transmits the data signal Dm received from the data line 171 to the source electrode S1 of the driving transistor T1.

A gate electrode G3 of the compensation transistor T3 is connected to the scan line 151, a source electrode S3 of the compensation transistor T3 is connected to the anode of the organic light emitting diode (OLED) via the light emission control transistor T6 while being connected to the drain electrode D1 of the driving transistor T1, and a drain electrode D3 of the compensation transistor T3 is connected to a drain electrode D4 of the initialization transistor T4, the first terminal Cst1 of the storage capacitor Cst, and the gate electrode G1 of the driving transistor T1. The compensation transistor T3 can be turned on by the scan signal Sn received from the scan line 151 to connect the gate electrode G1 and the drain electrode D1 of the driving transistor T1 so as to diode-connect the driving transistor T1.

A gate electrode G4 of the initialization transistor T4 is connected to the front end scan line 152, the source electrode S4 of the initialization transistor T4 is connected to the initialization voltage line 192, and the drain electrode D4 of the initialization transistor T4 is connected to the first terminal Cst1 of the storage capacitor Cst via the drain electrode D3 of the compensation transistor T3 and the gate electrode G1 of the driving transistor T1. The initialization transistor T4 can be turned on by the front end scan signal Sn−1 received from the front end scan line 152 to transmit the initialization voltage Vint to the gate electrode G1 of the driving transistor T1 to initialize a gate voltage of the gate electrode G1 of the driving transistor T1.

A gate electrode G5 of the operation control transistor T5 is connected to the light emission control line 153, the source electrode S5 of the operation control transistor T5 is connected to the driving voltage line 172, and the drain electrode D5 of the operation control transistor T5 is connected to the source electrode S1 of the driving transistor T1 and the drain electrode 32 of the switching transistor T2.

A gate electrode G6 of the light emission control transistor T6 is connected to the light emission control line 153, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the organic light emitting diode (OLED). The operation control transistor 115 and the light emission control transistor T6 can be simultaneously turned on by the light emission control signal EM received from the light emission control line 153 and thus the driving voltage ELVDD can be compensated by the diode-connected driving transistor T1 and transmitted to the organic light emitting diode (OLED).

A gate electrode G7 of the bypass transistor T7 is connected to the bypass control line 158, a source electrode S7 of the bypass transistor T7 is connected to the drain electrode D6 of the light emission control transistor T6 and the anode of the organic light emitting diode (OLED), and a drain electrode D7 of the bypass transistor T7 is connected to the initialization voltage line 192 and the source electrode S4 of the initialization transistor T4. Here, the bypass control line 158 can be connected to the front end scan line 152, and therefore the bypass signal BP can be the same as the front end scan signal Sn−1.

The second terminal Cst2 of the storage capacitor Cst is connected to the driving voltage line 172, and a cathode of the organic light emitting diode (OLED) can be connected to a common voltage line 741 through which a common voltage ELVSS is transmitted.

An exemplary embodiment of the present disclosure describes a 7tr 1 cap structure that includes the bypass transistor T7, but embodiments are not limited thereto, and therefore the number of transistors and the number of capacitors may vary.

Hereinafter, a detailed operation of one pixel of an organic light emitting diode display according to an exemplary embodiment of the present disclosure will be described in detail with reference to FIG. 5.

Figure 5:
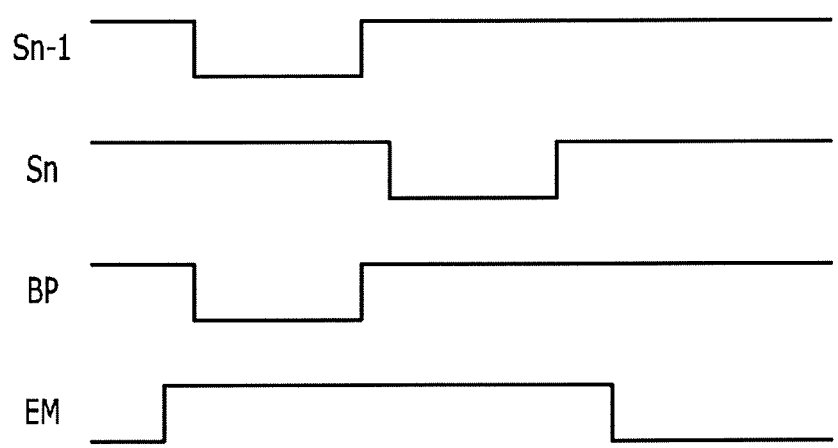
FIG. 5 is a timing diagram of a signal applied to a pixel of an organic light emitting diode display according to an exemplary embodiment of the present disclosure.

FIG. 5 is a timing diagram of a signal applied to a pixel of an organic light emitting diode display according to an exemplary embodiment of the present disclosure.

As illustrated in FIG. 5, first, a low-level front end scan signal Sn−1 is transmitted through the front end scan line 152 for an initialization period. Next, the initialization transistor T4 is turned by the low-level front end scan signal Sn−1, the initialization voltage Vint is transmitted to the gate electrode G1 of the driving transistor T1 from the initialization voltage line 192 through the initialization transistor T4, and the driving transistor T1 is initialized by the initialization voltage Vint.

Next, the low-level scan signal Sn is transmitted through the scan line 151 for a data programming period. Next, the switching transistor T2 and the compensation transistor T3 are turned by the low-level scan signal Sn. In this case, the driving transistor T1 is diode-connected by the turned on compensation transistor T3 and is biased forward.

Next, a compensation voltage Dm+Vth, where Vth is a negative value that reduces the data signal Dm received from the data line 171, is transmitted to the gate electrode G1 of the driving transistor T1. Here, Vth is a threshold voltage of the driving transistor T1. The driving voltage ELVDD and the compensation voltage Dm+Vth are transmitted to both terminals of the storage capacitor Cst and a charge corresponding to the voltage difference between both terminals of the storage capacitor Cst is stored in the storage capacitor Cst.

Next, the light emission control signal EM received from the light emission control line 153 changes from a high level to a low level for an emission period. Next, the operation control transistor T5 and the light emission control transistor T6 are turned on by the low-level light emission control signal EM for the emission period.

Next, a driving current Id corresponding to a voltage difference between the gate voltage Vg of the gate electrode G1 of the driving transistor T1 and the driving voltage ELVDD is generated and transmitted to the organic light emitting diode (OLED) through the light emission control transistor T6. A driving gate-source voltage Vgs of the driving transistor T1 is maintained at (Dm+Vth)-ELVDD by the storage capacitor Cst for the emission period and depending on a current-voltage relationship of the driving transistor T1, the driving current Id is proportional to a square $(Dm-ELVND)^2$ of a value obtained by subtracting the threshold voltage from the driving gate-source voltage. Therefore, the driving current Id can be determined independent of the threshold voltage Vth of the driving transistor T1.

In this case, the bypass transistor T7 receives a bypass signal BP from the bypass control line 158. In this case, some of the driving current Id exits through the bypass transistor T7 as a bypass current Ibp.

The display of a black image in an organic light emitting diode (OLED) needs a minimum driving current for the driving transistor T1. However, even if the driving current is at this minimum, the OLED may emit light, in which case a black image will not properly displayed.

Therefore, the bypass transistor T7 of a foldable display device according to an exemplary embodiment of the present disclosure may disperse some of the minimum current of the driving transistor T1 to a current path other than the current path to the organic light emitting diode. The current path to which the minimum current is dispersed may be referred to as the bypass current Ibp.

Here, the minimum current of the driving transistor T1 refers a current in which the driving gate-source voltage Vgs of the driving transistor T1 is less than the threshold voltage Vth and the driving transistor T1 is turned off. When the driving transistor T1 is turned off, the minimum driving current, such as a current which is equal to or less than 10 pA, is transmitted to the organic light emitting diode (OLED) and is represented by black. When a minimum driving current representing black flows, the effect of the bypass transfer of the bypass current Ibp is large, but when a large driving current that represents an image pure white flows, the effect of the bypass current Ibp may be negligible.

Therefore, when a driving current representing black flows, a light emitting current Ioled of the organic light emitting diode (OLED) is reduced by an amount corresponding to the bypass current Ibp to a minimum current amount needed to represent a black image. Therefore, an accurate black luminance image is achieved using the bypass transistor T7 to improve a contrast ratio. In FIGS. 4 and 5, the bypass signal BP may be the same as the front end scan signal Sn−1, but embodiments are not necessarily limited thereto.

Next, a structural disposition of a plurality of pixels of an organic light emitting diode display illustrated in FIGS. 4 and 5 will be described in detail with reference to FIG. 6.

Figure 6:
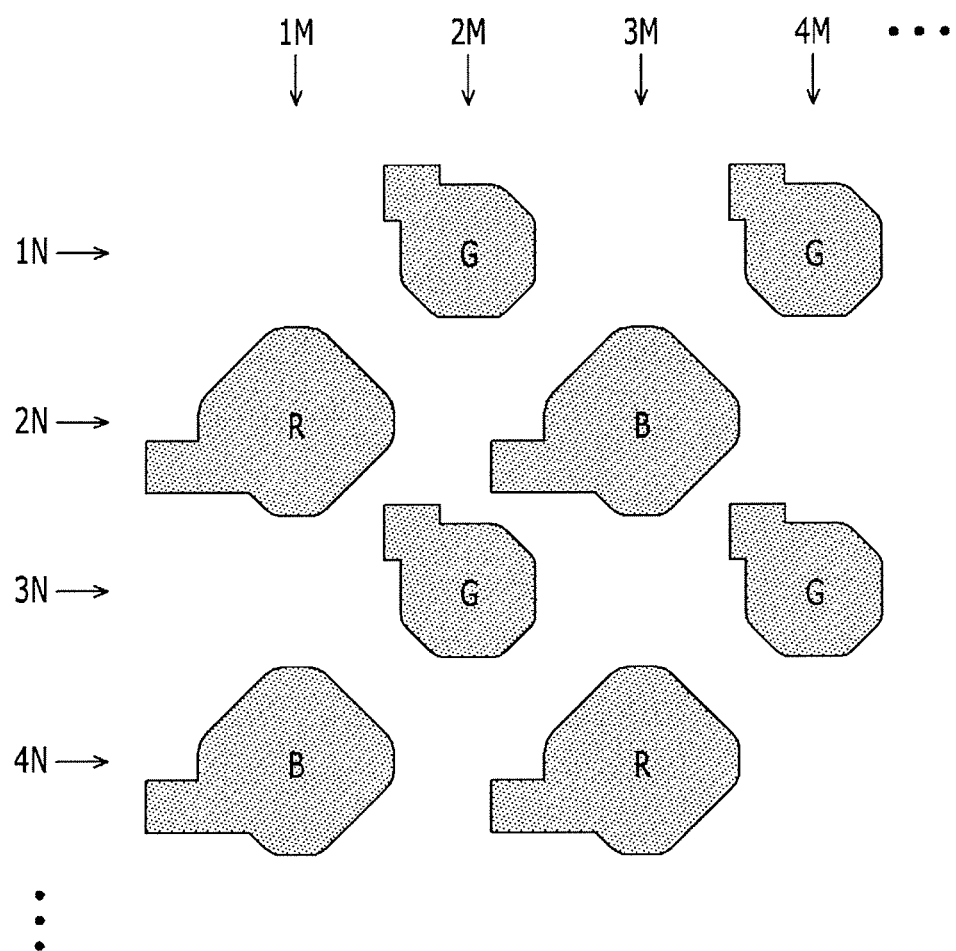
FIG. 6 is a schematic layout view of a plurality of pixels of an organic light emitting diode display according to an exemplary embodiment of the present disclosure.

FIG. 6 is a schematic layout view of a plurality of pixels of an organic light emitting diode display according to an exemplary embodiment of the present disclosure.

As illustrated in FIG. 6, a plurality of green pixels Gs are disposed in a first row 1N and spaced apart from each other by a predetermined interval, a red pixel R and a blue pixel B are alternately disposed in a second row 2N adjacent to the first row 1N, the plurality of green pixels Gs are disposed in a third row 3N adjacent to the second row 2N and spaced apart from each other by the predetermined interval, and the blue pixel B and the red pixel R are alternately disposed in a fourth row 4N adjacent to the third row 3N, which is repeated up to an N-th row.

Further, the red pixel R and the blue pixel B are alternately disposed in a first column 1M, the plurality of green pixels Gs are disposed in a second column 2M adjacent to the first column 1M and spaced apart from each other by a predetermined interval, the blue pixel B and the red pixel R are alternately disposed in a third column 3M adjacent to the second column 2M, and the plurality of green pixels Gs are disposed in a fourth column 4M adjacent to the third column 3M and spaced apart from each other by the predetermined interval, which is repeated up to an M-th column.

The structural disposition of the pixels is called a pentile matrix and applies when adjacent pixels may be shared to represent colors, thereby implementing high resolution with a small number of pixels.

Hereinafter, a detailed structure of an organic light emitting diode display according to an exemplary embodiment of the present disclosure to which the structural disposition of the pixels illustrated in FIG. 6 is applied will be described in detail with reference to FIGS. 7 to 9.

Figure 7:
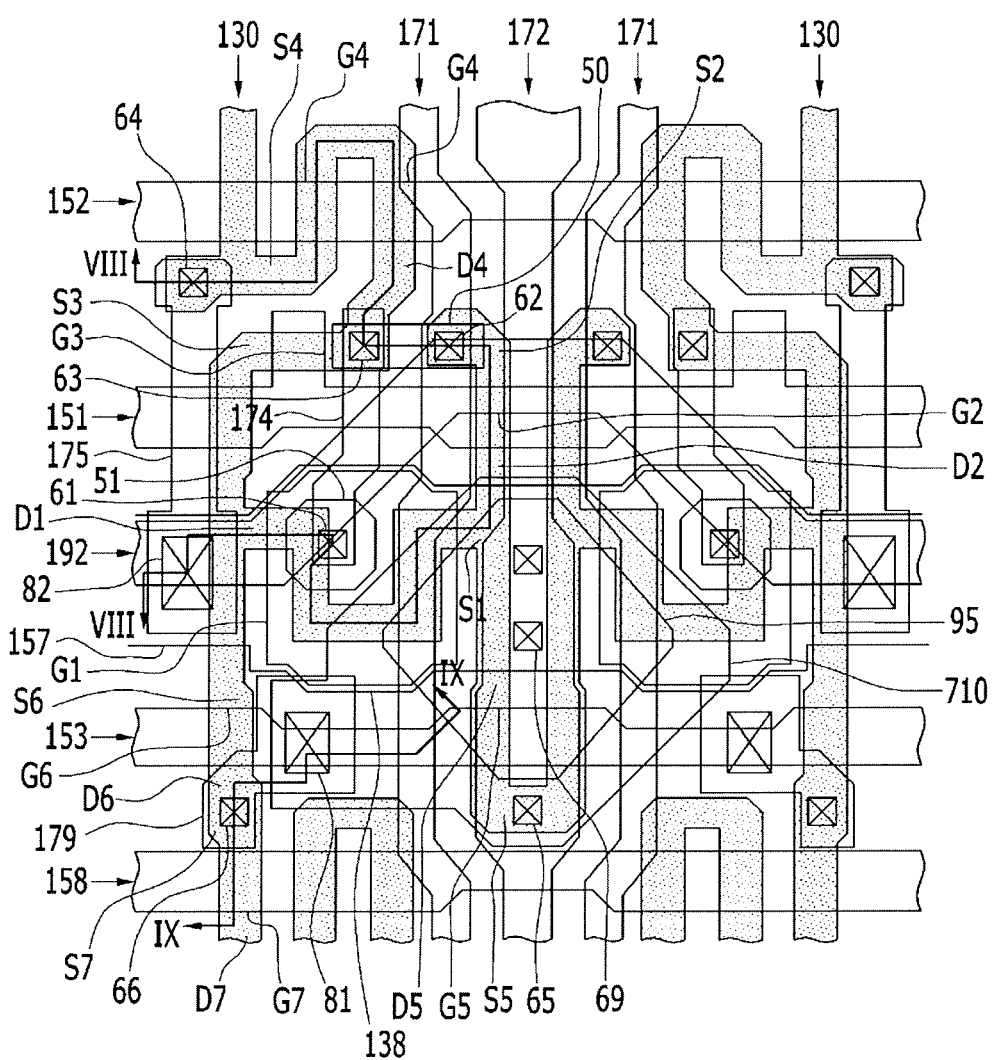
FIG. 7 is a layout view of a plurality of pixels of an organic light emitting diode display according to an exemplary embodiment of the present disclosure.
Figure 8:
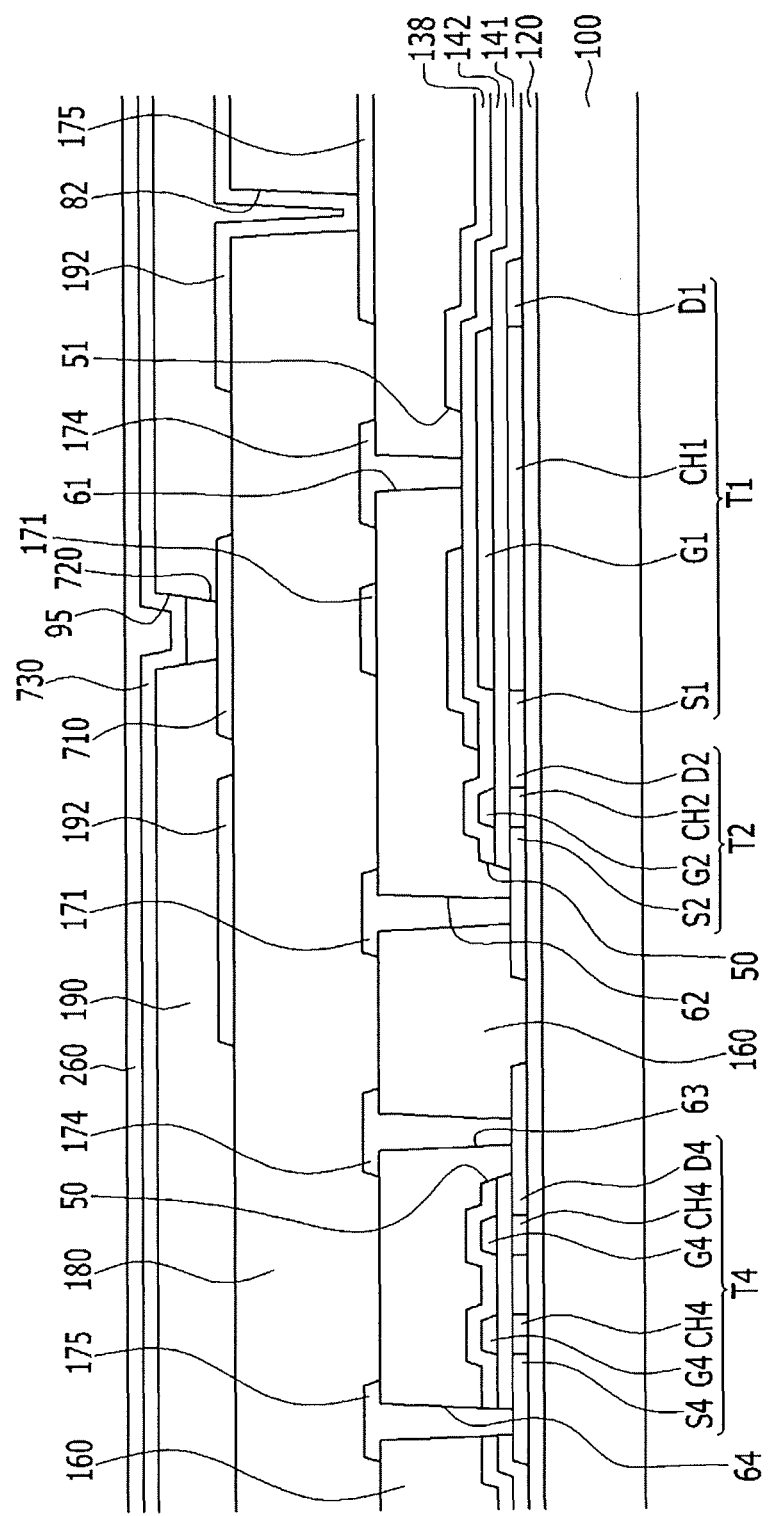
FIG. 8 is a cross-sectional view taken along the line of FIG. 7.
Figure 9:
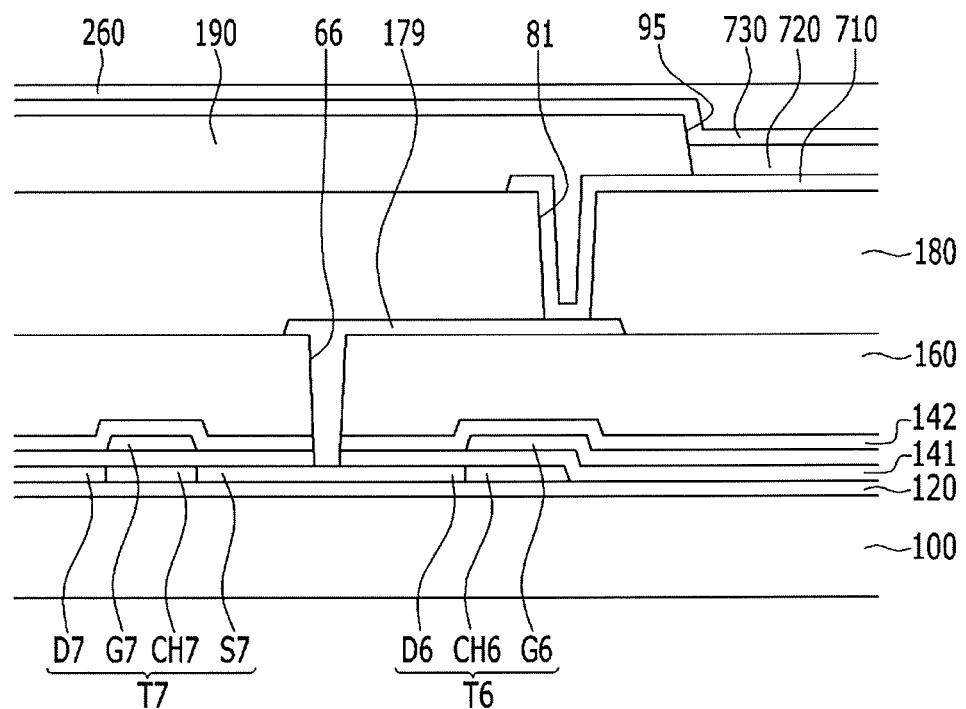
FIG. 9 is a cross-sectional view taken along the line IX-IX of FIG. 7.

FIG. 7 is a layout view of a plurality of pixels of an organic light emitting diode display according to an exemplary embodiment of the present disclosure, FIG. 8 is a cross-sectional view taken along the line of FIG. 7, and FIG. 9 is a cross-sectional view taken along the line IX-IX of FIG. 7.

Hereinafter, a detailed plane structure of an organic light emitting diode display according to an exemplary embodiment of the present disclosure will first be described with reference to FIG. 7 and a detailed cross section structure thereof will be described with reference to FIGS. 8 and 9.

As illustrated in FIG. 7, an organic light emitting diode display according to an exemplary embodiment of the present disclosure transmits the bypass signal BP, respectively, to the pixel, and includes the scan line 151, the front end scan line 152, the light emission control line 153, and the bypass control line 158 which extend in a row direction. Further, a organic light emitting diode display includes the data line 171 and the driving voltage line 172, which intersect the scan line 151, the front end scan line 152, the light emission control line 153, and the bypass control line 158 and transmits the data signal Dm and the driving voltage ELVDD to the pixel. The initialization voltage Vint is transmitted from the initialization voltage line 192 to the compensation transistor T3 via the initialization transistor T4. The initialization voltage line 192 may alternately have a straight line portion and an oblique line portion.

Further, the pixel PX is provided with the driving transistor T1, the switching transistor T2, the compensation transistor T3, the initialization transistor T4, the operation control transistor T5, the light emission control transistor 16, the bypass transistor T7, the storage capacitor Cst, and the organic light emitting diode (OLED). The pixel PX illustrated in FIG. 7 may correspond to either the red pixel R or the blue pixel B of the pentile matrix structure.

The organic light emitting diode (OLED) includes a first electrode 710, an organic emission layer 720, and a second electrode 730. In this case, the compensation transistor T3 and the initialization transistor T4 are configured as transistors having a dual gate structure to cut off a leakage current.

Each channel of the driving transistor T1, the switching transistor T2, the compensation transistor T3, the initialization transistor T4, the operation control transistor T5, the light emission control transistor T6, and the bypass transistor 17 is formed inside one connected semiconductor 130 which may be curved into various shapes.

The semiconductor 130 may be made of polysilicon or an oxide semiconductor. The oxide semiconductor may include one of an oxide of titanium (Ti), hafnium (Hf), zirconium (Zr), aluminum (Al), tantalum (Ta), germanium (Ge), zinc (Zn), gallium (Ga), tin (Sn), or indium (In), an indium-gallium-zinc oxide (InGaZnO$_4$), an indium-zinc oxide (Zn—In—O), a zinc-tin oxide (Zn—Sn—O), an indium-gallium oxide (In—Ga—O), an indium-tin oxide (In—Sn—O), indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. When the semiconductor 130 is made of an oxide semiconductor, a separate passivation layer may be added to protect the oxide semiconductor, which is vulnerable to external factors, such as high temperature.

The semiconductor 130 includes a channel, which may be channel-doped with an N-type impurity or a P-type impurity, and a source doping region and a drain doping region respectively formed at each side of the channel and which have a doping concentration higher than that of the doping impurity in the channel. According to an exemplary embodiment of the present disclosure, the source doping region and the drain doping region each correspond to the source electrode and the drain electrode. The source electrode and the drain electrode in the semiconductor 130 may be formed by doping the corresponding region. Further, the regions between the source and drain electrodes of different transistors in the semiconductor 130 are doped, and thus the source electrodes may be electrically connected to the drain electrodes.

As illustrated in FIG. 7, the semiconductor 130 includes a driving channel CH1 in the driving transistor T1, a switching channel CH2 in the switching transistor T2, a compensation channel CH3 in the compensation transistor T3, an initialization channel CH4 in the initialization transistor T4, an operation control channel CH5 in the operation control transistor T5, a light emission control channel CH6 in the light emission control transistor T6, and a bypass channel CH7 in the bypass transistor T7.

The driving transistor T1 includes the driving channel CH1, a driving gate electrode G1, a driving source electrode S1, and a driving drain electrode D1. The driving channel CH1 may be curved and may have a meandering shape or a zigzag shape. As such, by being curved, a long driving channel CH1 may be formed in a narrow space. Therefore, a driving range of the driving gate-source voltage Vgs between the driving gate electrode G1 and the driving source electrode S1 can be widened by the long driving channel CH1. Since the driving range of the driving gate-source voltage Vgs is wide, it is possible to more precisely control gray levels of light emitted from the organic light emitting diode (OLED) by changing a magnitude of the driving gate-source voltage Vgs, thereby increasing resolution of the organic light emitting diode display and improving a display quality. The shape of the driving channel. CH1 can vary and can includes shapes such as a 'reverse S', an 'S', an 'M', a 'W', etc., in other exemplary embodiments The driving gate electrode G1 overlaps the driving channel CH1, and the driving source electrode S1 and the driving drain electrode D1 are respectively adjacent to each side of the driving channel CH1. The driving gate electrode G1 is connected to a first data connecting member 174 through a contact hole 61.

The switching transistor T2 includes a switching channel CH2, a switching gate electrode G2, a switching source electrode S2, and a switching drain electrode D2. The switching gate electrode G2 protrudes from the scan line 151 and overlaps the switching channel CH2, and the switching source electrode S2 and the switching drain electrode D2 are respectively adjacent to each side of the switching channel CH2. The switching source electrode S2 is connected to the data line 171 through a contact hole 62.

The compensation transistor T3 includes the compensation channel CH3, the compensation gate electrode G3, the compensation source electrode S3, and the compensation drain electrode D3. The compensation gate electrode G3 is a portion of the scan line 151 formed in two parts to prevent a leakage current and overlaps the compensation channel CH3. The compensation source electrode S3 and the compensation drain electrode D3 are respectively adjacent to each side of the compensation channel CH3. The compensation drain electrode G3 is connected to a first data connecting member 174 through a contact hole 63.

The initialization transistor T4 includes the initialization channel CH4, the initialization gate electrode G4, the initialization source electrode S4, and the initialization drain electrode D4. The initialization gate electrode G4 is a portion of the front end scan line 152 formed in two parts to prevent a leakage current and overlaps the initialization channel CH4. The initialization source electrode S4 and the initialization drain electrode D4 are respectively adjacent to each side of the initialization channel CH4. The initialization source electrode S4 is connected to a second data connecting member 175 through a contact hole 64.

The operation control transistor T5 includes the operation control channel CH5, the operation control gate electrode G5, the operation control source electrode S5, and the operation control drain electrode D5. The operation control gate electrode G5 is a portion of the light emission control line 153 that overlaps the operation control channel CH5, and the operation control source electrode S5 and the operation control drain electrode D5 are respectively adjacent to each side of the operation control channel CH5. The operation control source electrode S5 is connected to a portion extending from the driving voltage line 172 through a contact hole 65.

The light emission control transistor T6 includes the light emission control channel CH6, the light emission control gate electrode G6, the light emission control source electrode S6, and the light emission control drain electrode D6. The light emission control gate electrode G6 is a portion of the light emission control line 153 that overlaps the light emission control channel CH6, and the light emission control source electrode S6 and the light emission control drain electrode D6 are respectively adjacent to each side of the light emission control channel CH6. The light emission control drain electrode D6 is connected to a third data connecting member 179 through a contact hole 66.

The bypass transistor T7 includes a bypass channel CH7, the bypass gate electrode G7, the bypass source electrode S7, and the bypass drain electrode D7. The bypass gate electrode G7 is a portion of the bypass control line 158 that overlaps the bypass channel CH7n and the bypass source electrode S7 and the bypass drain electrode D7 are respectively adjacent to each side of the bypass channel CH7.

The bypass source electrode S7 is directly connected to the light emission control drain electrode D6 and the bypass drain electrode D7 is directly connected to the initialization source electrode S4.

One end of the driving channel CH1 of the driving transistor T1 is connected to the switching drain electrode D2 and the operation control drain electrode D5, and the other end of the driving channel CH1 is connected to the compensation source electrode S3 and the light emission control source electrode S6.

The storage capacitor Cst includes a first storage electrode 128 and a second storage electrode 138, and a second gate insulating layer 142 is disposed therebetween. The first storage electrode 128 corresponds to the driving gate electrode G1 and the second storage electrode 138 extends from a storage line 157, occupies an area wider than that of the driving gate electrode G1 and completely covers the driving gate electrode G1.

Here, the second gate insulating layer 142 includes a dielectric material and storage capacitance is determined by the charge charged in the storage capacitor Cst and the voltage between both storage electrodes 128 and 138. As such, the driving gate electrode G1 can be used as the first storage electrode 128, and thus the storage capacitor may be formed in a space that is narrower due to the large area occupied by the driving channel CH1 within the pixel.

The first storage electrode 128 is the driving gate electrode G1 and is connected to one end of the first data connecting member 174 through the contact hole 61 and the storage opening 51. The storage opening 51 is formed in the second storage electrode 138, and the contact hole 61 through which one end of the first data connecting member 174 connects to the driving gate electrode G1 is contained within the storage opening 51. The first data connecting member 174 is formed on the same layer as and is approximately parallel the data line 171, and the other end of the first data connecting member 174 is connected to the compensation drain electrode D3 of the compensation transistor T3 and the initialization drain electrode D4 of the initialization transistor T4 through the contact hole 63. Therefore, the first data connecting member 174 connects the driving gate electrode G1, the compensation drain electrode D3 of the compensation transistor T3, and the initialization drain electrode D4 of the initialization transistor T4. The first data connecting member 174 corresponds to a driving gate node illustrated in the equivalent circuit diagram of FIG. 4.

The second storage electrode 138 is connected to the driving voltage line 172 through a contact hole 69.

Therefore, the storage capacitor Cst stores the storage capacitance corresponding to the difference between the driving voltage ELVDD transmitted to the second storage electrode 138 through the driving voltage line 172 and the driving gate voltage Vg of the driving gate electrode G1.

The first data connecting member 174 extends in a direction parallel with the data line 171 and intersects the scan line 151.

In addition, the third data connecting member 179 is connected to the first electrode 710 through a contact hole 81 and the second data connecting member 175 is connected to the initialization voltage line 192 through a contact hole 82.

Hereinafter, a cross section structure of an organic light emitting diode display according to an exemplary embodiment of the present disclosure will be describe in detail with respect to a stacked order with reference to FIGS. 8 and 9.

In this case, the operation control transistor T5 has substantially the same stacked structure as the light emission control transistor T6 and therefore a repeated detailed description thereof will be omitted.

The buffer layer 120 is formed on the substrate 100. The substrate 100 may be formed of an insulating substrate such as glass, quartz, ceramic, plastic, etc., and the buffer layer 120 can block impurities from the substrate 100 when a crystallization process is performed to form polysilicon to improve characteristics of the polysilicon and reduce stress applied to the substrate 100.

The semiconductor 130, which includes the driving channel CH1, the switching channel CH2, the compensation channel CH3, the initialization channel CH4, the operation control channel CH5, the light emission control channel CH6, and the bypass channel CH7, is formed on the buffer layer 120. The driving source electrode S1 and the driving drain electrode D1 are respectively formed at each side of the driving channel CH1 in the semiconductor 130, and the switching source electrode S2 and the switching drain electrode D2 are respectively formed at each side of the switching channel CH2. Further, the compensation source electrode S3 and the compensation drain electrode D3 are respectively formed at each side of the compensation channel CH3, and the initialization source electrode S4 and the initialization drain electrode D4 are respectively formed at each side of the initialization channel CH4. Further, the operation control source electrode S5 and the operation control drain electrode D5 are respectively formed at each side of the operation control channel CH5, and the light emission control source electrode S6 and the light emission control drain electrode D6 are respectively formed at each side of the light emission control channel CH6. Further, the bypass source electrode S7 and the bypass drain electrode D7 are respectively formed at each side of the bypass channel CH7.

A first gate insulating layer 141 is formed on the semiconductor 130 to cover the semiconductor 130. The first gate wirings 151, 152, 153, 158, G1, G2, G3, G4, G5, G6, and G7 are formed on the first gate insulating layer 141. The scan line 151 includes the switching gate electrode G2 and the compensation gate electrode G3, the front end scan line 152 includes the initialization gate electrode G4, the light emission control line 153 includes the operation control gate electrode G5 and the light emission control gate electrode G6, and the bypass control line 158 includes the bypass gate electrode G7.

A second gate insulating layer 142 is formed on the first gate wirings 151, 152, 153, 158, G1, G2, G3, G4, G5, G6, and G7 and the first gate insulating layer 141 to cover the first gate wirings 151, 152, 153, 158, G1, G2, G3, G4, G5, G6, and G7 and the first gate insulating layer 141. The first gate insulating layer 141 and the second gate insulating layer 142 may include silicon nitride (SiNx), silicon oxide (SiO$_2$), etc.

The insulating layer opening 50 through which the initialization drain electrode D4 and the switching source electrode S2 are exposed is formed through the second gate insulating layer 142 and the first gate insulating layer 141.

The second gate wirings, which include the storage line 157, which is parallel to the scan line 151, and the second storage electrode 138, which extends from the storage line 157, are formed on the second gate insulating layer 142. The second storage electrode 138 is wider than the first storage electrode 128, which serves as the driving gate electrode, and therefore the second storage electrode 138 completely covers the driving gate electrode G1. Therefore, the second storage electrode 138 blocks the effect of a voltage change in the driving gate electrode G1 on the voltage of the first electrode 710 that overlaps the driving gate electrode G1.

An interlayer insulating layer 160 is formed on the second gate insulating layer 142 and the second gate wirings 157 and 138. The interlayer insulating layer 160 may include silicon nitride (SiNx), silicon oxide (SiO$_2$), etc.

The contact holes 61, 62, 63, 64, 65, 66, and 69 are formed to penetrate through the interlayer insulating layer 160. The data wirings 171, 172, 174, 175, and 179, which include the data line 171, the driving voltage line 172, the first data connecting member 174, the second data connecting member 175, and the third data connecting member 179, are formed on the interlayer insulating layer 160.

The contact holes 62 and 63 are positioned within the insulating layer openings 50.

The data line 171 is connected to the switching source electrode S2 through the contact hole 62 which penetrates through the first gate insulating layer 141, the second gate insulating layer 142, and the interlayer insulating layer 160. One end of the first data connecting member 174 is connected to the driving gate electrode G1, which is connected to the first storage electrode through the contact hole 61 that penetrates the second gate insulating layer 142 and the interlayer insulating layer 160. The other end of the first data connecting member 174 is connected to the compensation drain electrode D3 and the initialization drain electrode D4 through the contact hole 63, which penetrates through the first gate insulating layer 141, the second gate insulating layer 142, and the interlayer insulating layer 160.

The second data connecting member 175, which extends parallel to the data line 171, is connected to the initialization source electrode S4 through the contact hole 64 which penetrates through the first gate insulating layer 141, the second gate insulating layer 142, and the interlayer insulating layer 160. Further, the third data connecting member 179 is connected to the light emission control drain electrode D6 through the contact hole 66. which penetrates through the first gate insulating layer 141, the second gate insulating layer 142, and the interlayer insulating layer 160.

A passivation layer 180 is formed on the data wirings 171, 172, 174, 175, and 179 and the interlayer insulating layer 160 to cover the data wirings 171, 172, 174, 175, and 179 and the interlayer insulating layer 160. The passivation layer 180 may include an organic layer.

The first electrode 710 and the initialization voltage line 192 are formed on the passivation layer 180. The third data connecting member 179 is connected to the first electrode 710 through the contact hole 81 which penetrates the passivation layer 180, and the second data connecting member 175 is connected to the initialization voltage line 192 through the contact hole 82 which penetrates the passivation layer 180.

A pixel defined layer (PDL) 190 is formed on the passivation layer 180, the initialization voltage line 192, and an edge of the first electrode 710 to cover the passivation layer 180, the initialization voltage line 192, and the edge of the first electrode 710. The pixel defined layer 190 includes a plurality of pixels PXs and has a pixel opening 95 through which the first electrode 710 is exposed. The pixel defined layer 190 may include a resin, such as a polyacrylate or a polyimide, a silica-based inorganic materials, etc.

The organic emission layer 720 is formed on the first electrode 710 exposed through the pixel opening 95, and the second electrode 730 is formed on the organic emission layer 720. The second electrode 730 is also formed on the pixel defined layer 190 and is thus formed over the plurality of pixels PXs. As such, the organic light emitting diode (OLED), which includes the first electrode 710, the organic emission layer 720, and the second electrode 730, is formed.

Here, the first electrode 710 is an anode which is a hole injection electrode, and the second electrode 730 is a cathode which is an electron injection electrode. However, exemplary embodiments of the present disclosure are not limited thereto and depending on how a foldable display device is driven, the first electrode 710 may be the cathode and the second electrode 730 may be the anode. Holes and electrons are respectively injected from the first electrode 710 and the second electrode 730 into the organic emission layer 720 and light is emitted when excitons, which are combinations of the injected holes and electrons, decay from an excited state to a ground state.

The organic emission layer 720 may include a low molecular weight organic material or a high molecular weight organic material such as poly 3,4-ethylenedioxythiophene (PEDOT), etc. Further, the organic emission layer 720 may have a multilayer structure which includes at least one of a light emitting layer, a hole injection layer (HIL), a hole transporting layer (HTL), an electron transporting layer (ETL), and an electron-injection layer (EIL). When all layers are included, the hole injection layer is disposed on the first electrode 710, and the hole transporting layer, the light emitting layer, the electron transporting layer, and the electron injection layer are sequentially stacked thereon.

The organic emission layer 720 may include a red organic emission layer which emits red light a green organic emission layer which emits green light, and a blue organic emission layer which emits blue light, and the red organic emission layer, the green organic emission layer, and the blue organic emission layer are each respectively formed in a red pixel, a green pixel, and a blue pixel to implement color.

Further, the organic emission layer 720 may implement color by stacking the red organic emission layer, the green organic emission layer, and the blue organic emission layer over all of the red, green, and blue pixels and forming a red filter, a green filter, and a blue filter for each pixel. As another example, color may also be implemented by forming a white organic emission layer which emits white light in each of the red, green and blue pixels, and forming a red filter, a green filter, and a blue filter for each pixel. When implementing color using a white organic emission layer and the color filters, there is no need to use a deposition mask for depositing the red, green or blue organic emission layers on each pixel, that is, the red pixel, the green pixel, and the blue pixel.

The white organic emission layer may include a single organic emission layer and may also be configured to emit white light by stacking the plurality of organic emission layers. For example, the white organic emission layer may be configured to emit white light by combining at least one yellow organic emission layer with at least one blue organic emission layer, by combining at least one cyan organic emission layer with at least one red organic emission layer, or by combining at least one magenta organic emission layer with at least one green organic emission layer, etc.

An encapsulation member that protects the organic light emitting diode (OLED) may be formed on the first electrode 710, and the encapsulation member may be encapsulated on the substrate 100 by a sealant and may include various materials, such as glass, quartz, ceramic, plastic, metal, etc. In addition, the inorganic layer and the organic layer may be deposited on the second electrode 730 without using a sealant to form a thin film encapsulation layer.

Hereinafter, a method for manufacturing an organic light emitting diode display will be described in detail with reference to FIG. 10 to 21 and FIGS. 7 to 9 described above according to an exemplary embodiment of the present disclosure.

Figure 10:
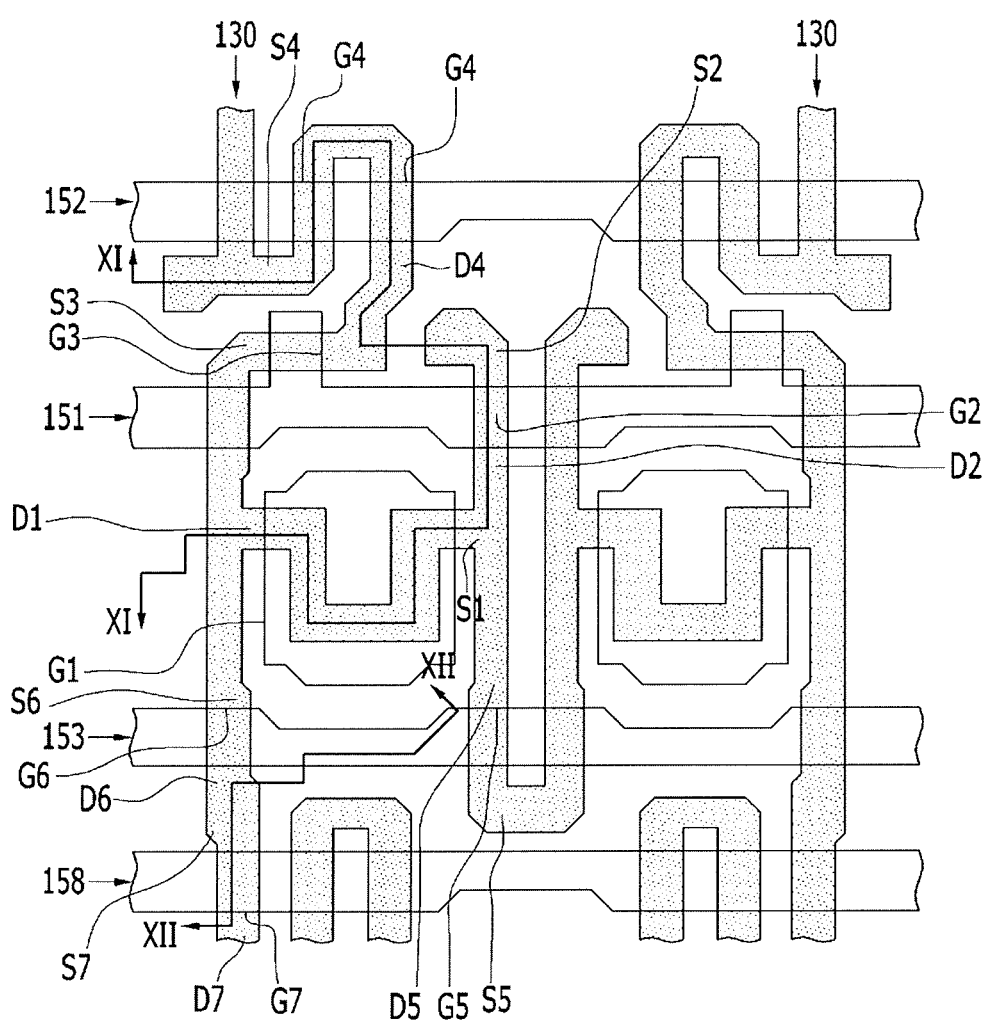
FIG. 10 is a layout view of an intermediate process that illustrates a method for manufacturing an organic light emitting diode display according to an exemplary embodiment of the present disclosure.
Figure 11:
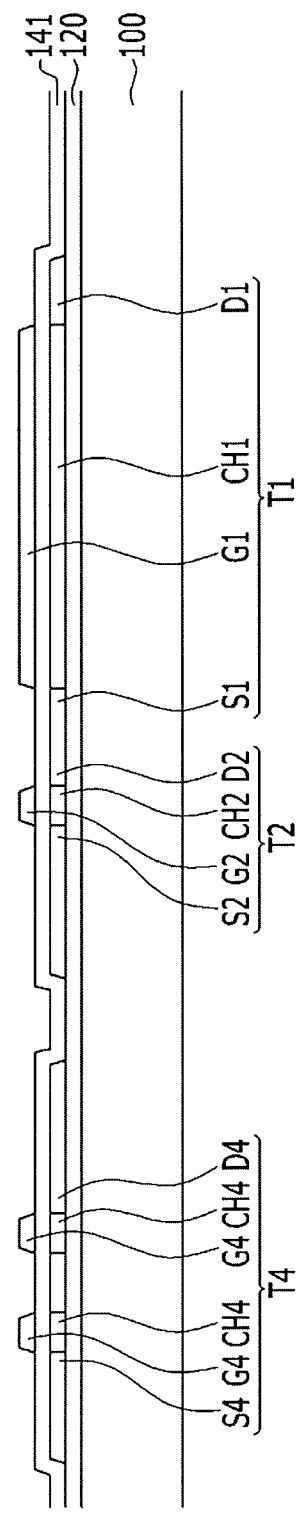
FIG. 11 is a cross-sectional view taken along the line XI-XI of FIG. 10.
Figure 12:
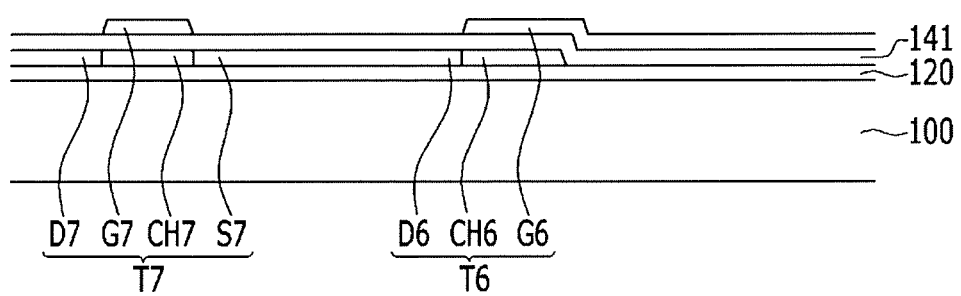
FIG. 12 is a cross-sectional view taken along the line XII-XII of FIG. 10.
Figure 13:
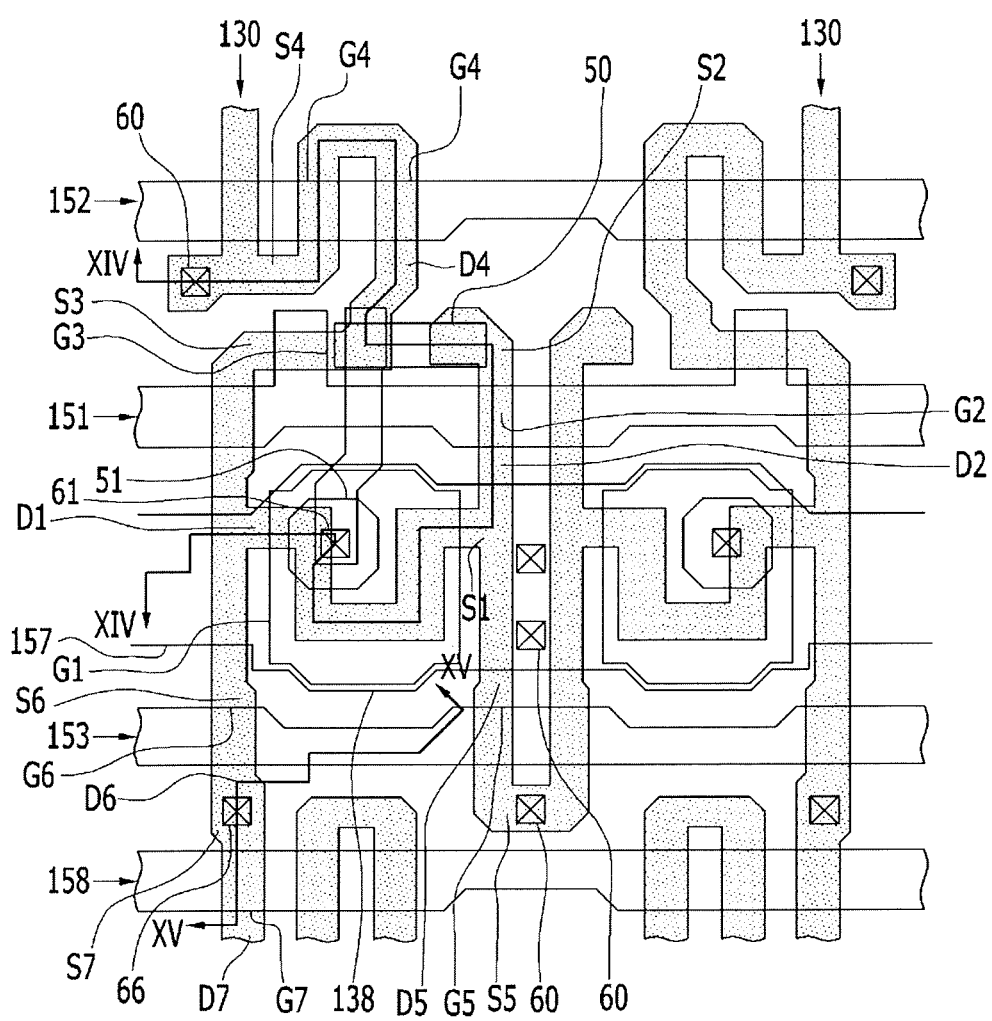
FIG. 13 is a layout view of a next process of FIG. 10.
Figure 14:
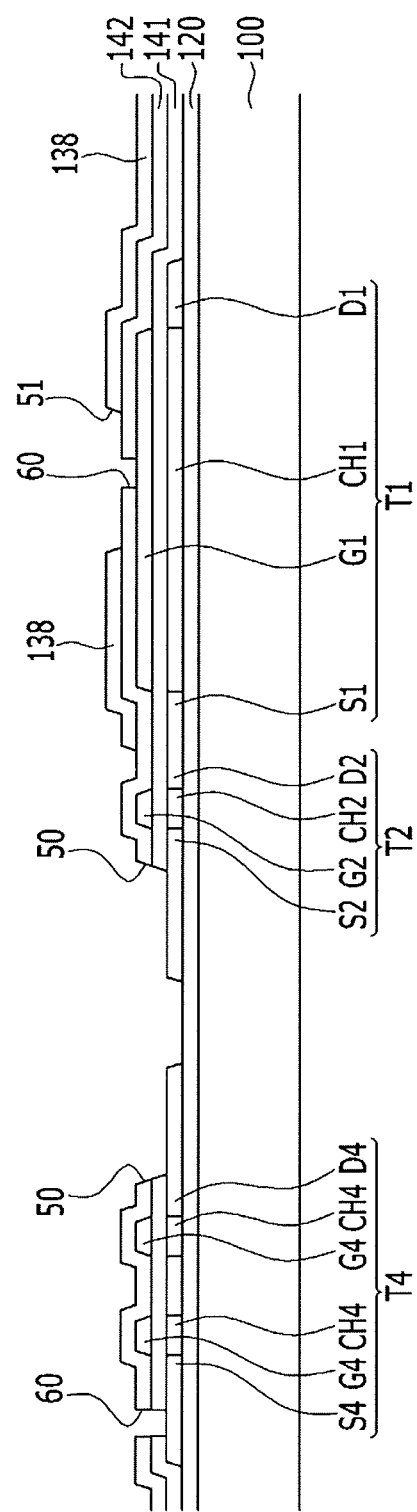
FIG. 14 is a cross-sectional view taken along the line XIV-XIV of FIG. 13.
Figure 15:
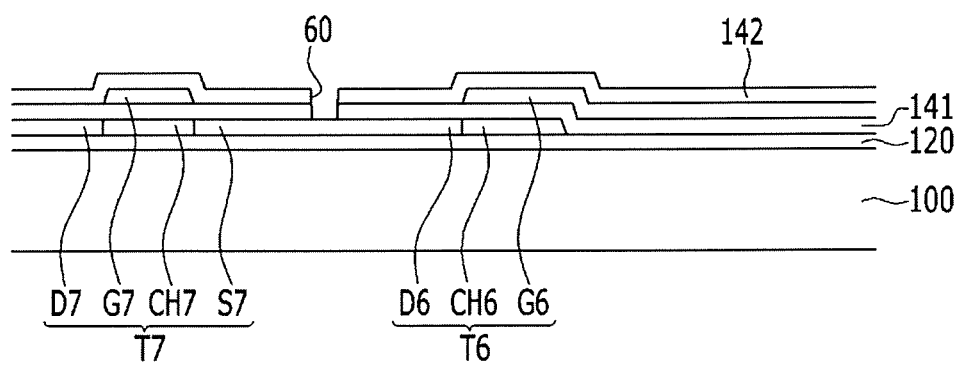
FIG. 15 is a cross-sectional view taken along the line XV-XV of FIG. 13.
Figure 16:
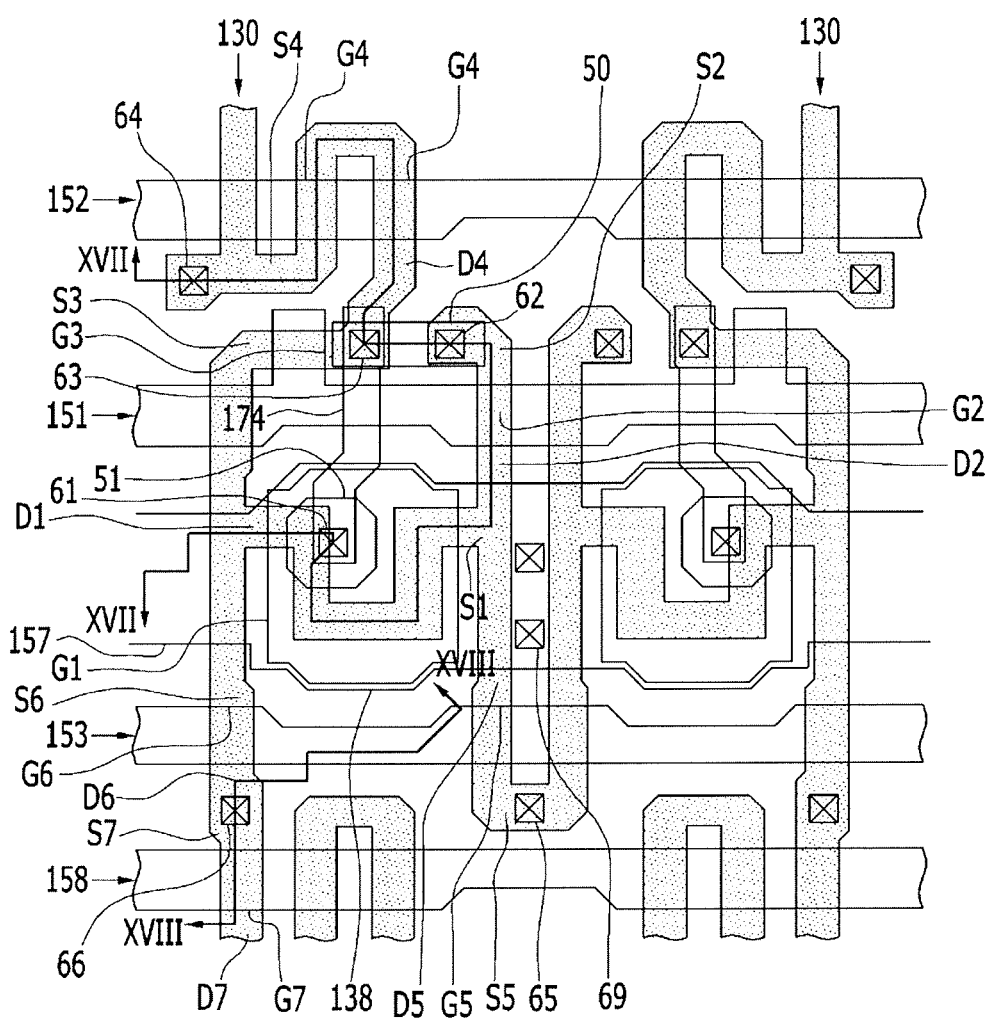
FIG. 16 is a layout view of a next process of FIG. 13.
Figure 17:
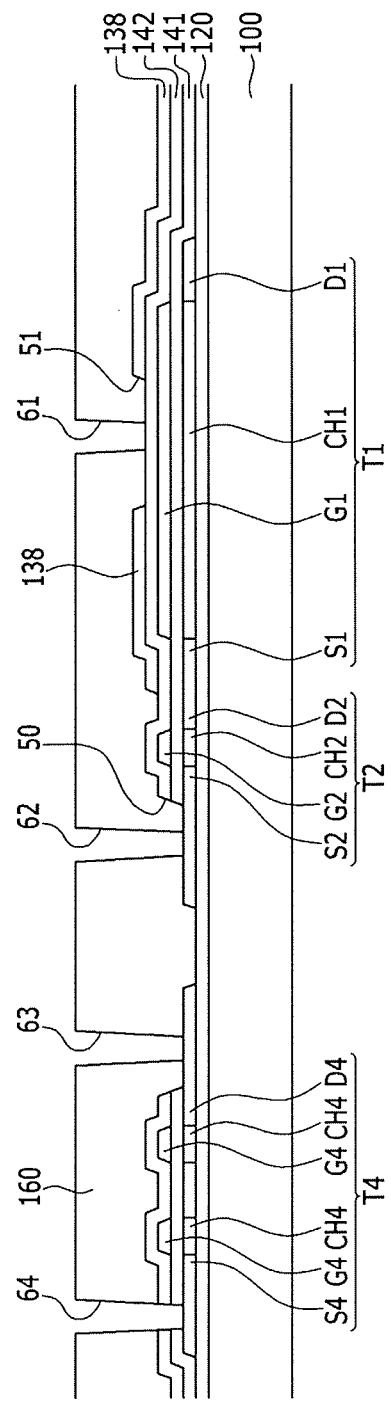
FIG. 17 is a cross-sectional view taken along the line XVII-XVII of FIG. 16.
Figure 18:
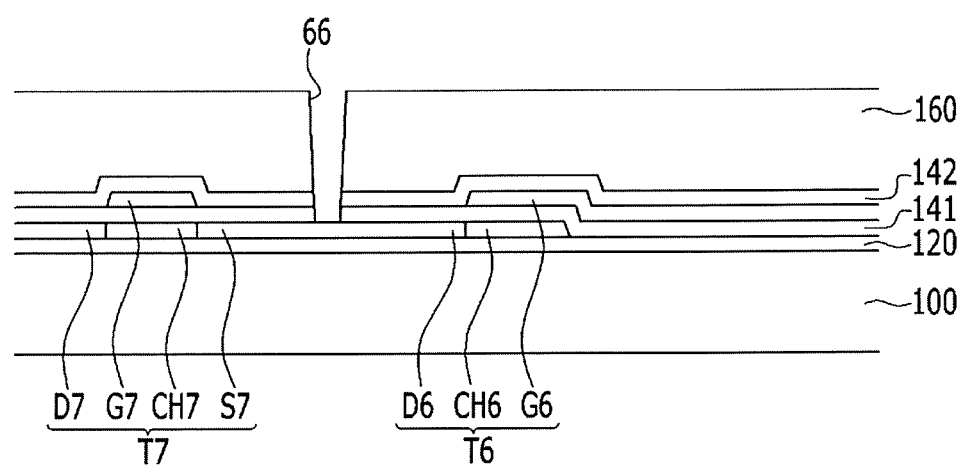
FIG. 18 is a cross-sectional view taken along the line of FIG. 16.
Figure 19:
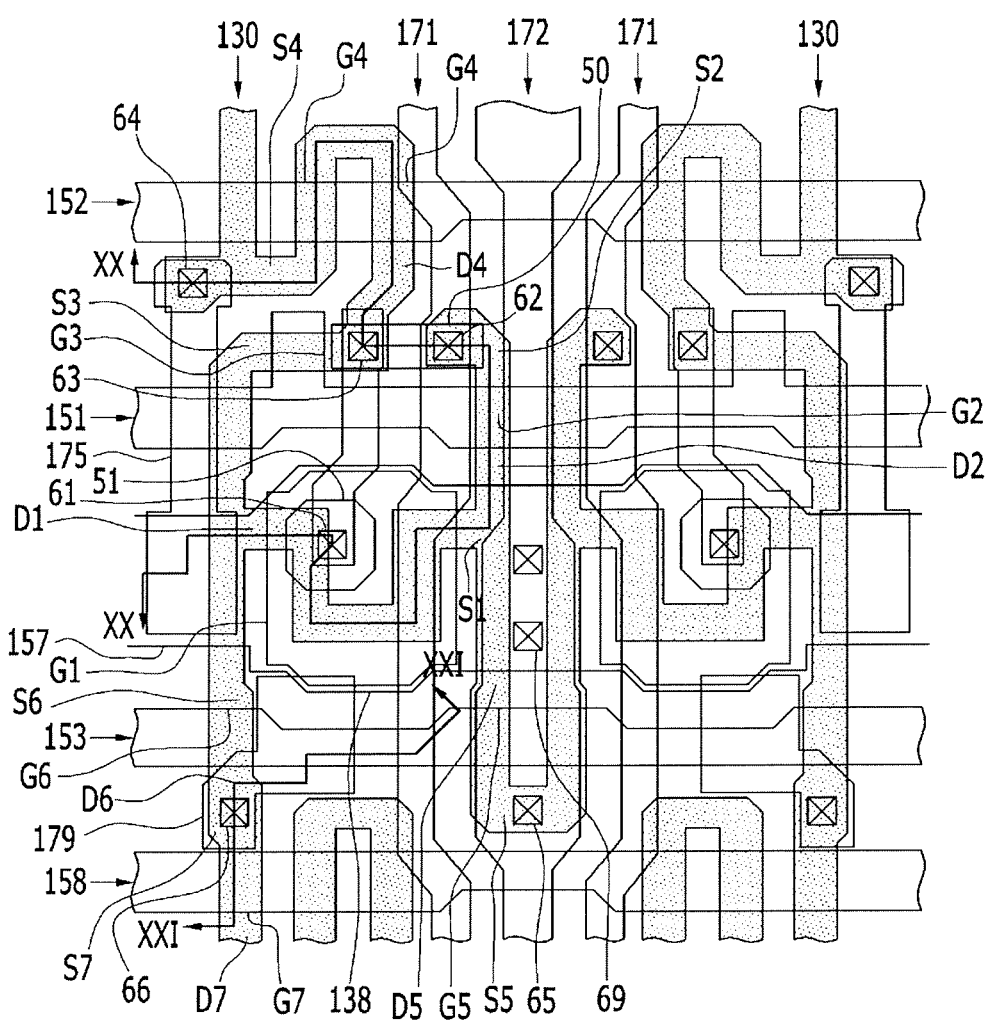
FIG. 19 is a layout view of a next process of FIG. 16.
Figure 20:
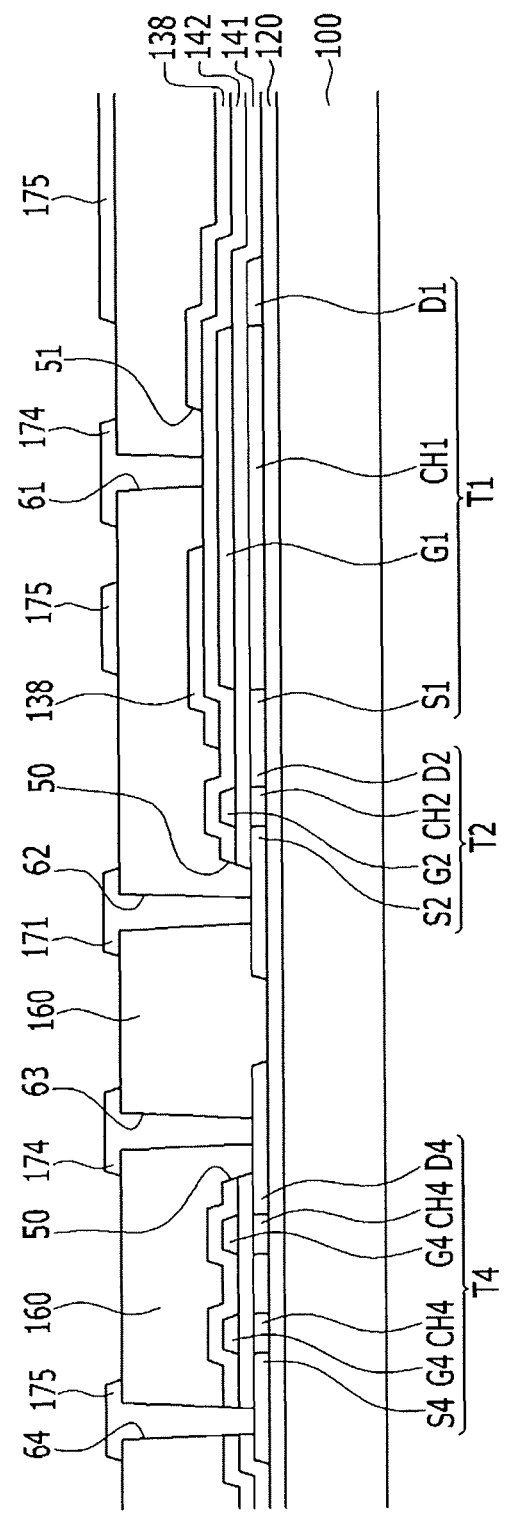
FIG. 20 is a cross-sectional view taken along the line XX-XX of FIG. 19.
Figure 21:
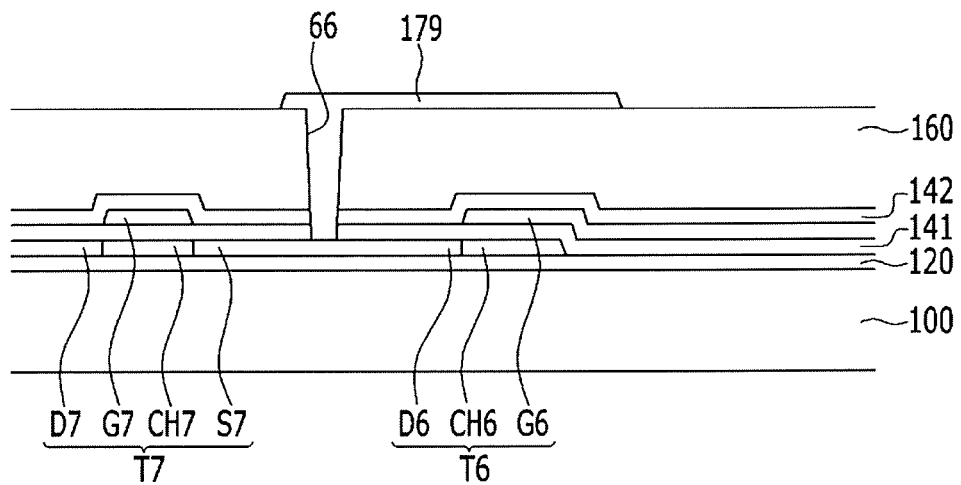
FIG. 21 is a cross-sectional view taken along the line XXI-XXI of FIG. 19.

FIG. 10 is a layout view of an intermediate process that illustrates a method for manufacturing an organic light emitting diode display according to an exemplary embodiment of the present disclosure, FIG. 11 is a cross-sectional view taken along the line XI-XI of FIG. 10, FIG. 12 is a cross-sectional view taken along the line of FIG. 10, FIG. 13 is a layout view of a next process of FIG. 10, FIG. 14 is a cross-sectional view taken along the line XIV-XIV of FIG. 13, FIG. 15 is a cross-sectional view taken along the line XV-XV of FIG. 13, FIG. 16 is a layout view of a next process of FIG. 13, FIG. 17 is a cross-sectional view taken along the line XVII-XVII of FIG. 16, FIG. 18 is a cross-sectional view taken along the line of FIG. 16, FIG. 19 is a layout view of a next process of FIG. 16, FIG. 20 is a cross-sectional view taken along the line XX-XX of FIG. 19, and FIG. 21 is a cross-sectional view taken along the line XXI-XXI of FIG. 19.

First, as illustrated in FIGS. 10 to 12, the buffer layer 120 is formed on the substrate 100. The buffer layer may include silicon nitride or silicon oxide.

Further, a polysilicon layer is formed on the buffer layer 120 and is then patterned to form the semiconductor 130.

Next, the first gate insulating layer 141 is formed on the semiconductor 130. The first gate insulating layer 141 may include an inorganic layer such as silicon nitride or silicon oxide.

Further, a metal layer is formed on the first gate insulating layer 141 and is then patterned to form the first gate wirings 151, 152, 153, 158, G1, G2, G3, G4, G5, G6, and G7.

Next, as illustrated in FIGS. 13 to 15, the second gate insulating layer 142 is formed on the first gate wirings 151, 152, 153, 1158, G1, G2, G3, G4, G5, G6, and G7. The second gate insulating layer 142 may include an inorganic layer such as silicon nitride or silicon oxide.

Further, the second gate insulating layer 142 and the first gate insulating layer 141 are etched by a photolithography process to form the insulating layer opening 50 through which the initialization drain electrode D4 and the switching source electrode S2 are exposed.

In this case, the preliminary contact hole 60 through which the driving gate electrode G1, the initialization source electrode S4, and the light emission control drain electrode D6 are exposed, is also formed.

Next, a metal layer is formed on the second gate insulating layer 142 and is then patterned to form the second gate wirings 157 and 138. In this case, the second storage electrode 138 is patterned to form the storage opening 51 around the preliminary contact hole 60.

Next, as illustrated in FIGS. 16 to 18, the interlayer insulating layer 160 is formed on the second gate wirings 157 and 138 from an organic material.

Next, the interlayer insulating layer 160 is etched by a photolithography process to form the contact holes 62 and 63 within the insulating layer opening 50 through which the driving source electrode S1 and the initialization drain electrode D4 are each exposed. In addition, the contact holes 61, 64, and 66 are formed to expose the driving gate electrode G1, the initialization source electrode S4, and the light emission control drain electrode D6, respectively.

When the interlayer insulating layer formed of an organic material and the gate insulating layer formed of an inorganic material are etched together, the interlayer insulating layer can be over-etched while the gate insulating layer, positioned under the interlayer insulating layer, is etched, and thus a distance between the two signal lines connected through the contact hole is reduced, which can cause crosstalk. However, according to an exemplary embodiment of the present disclosure, when the insulating layer opening 50 is formed and then the contact holes 62 and 63 are formed within the insulating layer opening 50, only the organic layer remains between the two contact holes, thereby increasing the distance between the two signal lines connected through the contact hole, which can minimize the occurrence of crosstalk therebetween.

Further, when the interlayer insulating layer is formed of a low-K organic layer, the interlayer insulating layer has a dielectric constant that is less than that of an inorganic layer, which can minimize parasitic capacitance between the two signal lines.

Next, as illustrated in FIGS. 19 to 21, a metal layer is formed on the interlayer insulating layer 160 and is then patterned to form the data wirings, which include the data line 171, the first data connecting member 174, the second data connecting member 175, the third data connecting member 179, and the driving voltage line 172, which are each respectively connected to the switching source electrode S2, the initialization drain electrode D4, the initialization source electrode S4, and the light emission control drain electrode D6, through the contact holes 62, 63, 64, and 66.

Next, as illustrated in FIGS. 7 to 9, the passivation layer 180 is formed on the data wirings 171, 172, 174, 175, and 179. Further, the contact hole 81 through which the third data connecting member 179 is exposed, and the contact hole 82 through which the second data connecting member 175 is exposed, are formed through the passivation layer 180.

Next, the first electrode 710 and the initialization voltage line 192, which are each respectively connected to the third data connecting member 179 and the second data connecting member 175 through the contact holes 81 and 82, are formed on the passivation layer 180.

Further, the pixel defined layer 190 is formed on the first electrode 710, the opening 95 is formed through the pixel defined layer 190, the organic emission layer 720 is formed within the opening 95, and the second electrode 730 and the encapsulation layer 260 are formed on the organic emission layer 720.

While embodiments of this disclosure have been described in connection with what is presently considered to be practical exemplary embodiments, it is to be understood that embodiments of the disclosure are not limited to the disclosed exemplary embodiments, but, on the contrary, are intended to cover various modifications and equivalent arrangements included within the spirit and scope of the appended claims.

What is claimed is:

1. An organic light emitting diode display, comprising:
   a substrate;
   a semiconductor disposed on the substrate, wherein the semiconductor includes a channel for each of a plurality of transistors, and doping regions formed at both sides of each channel;
   a gate insulating layer disposed on the semiconductor that includes an insulating layer opening which overlaps the doping regions of two different transistors of the plurality of transistors;
   a gate electrode disposed on the gate insulating layer that overlaps each channel;
   an interlayer insulating layer disposed on the gate electrode that includes a first contact hole and a second contact hole which overlaps the doping regions exposed within the insulating layer opening; and
   data wirings disposed on the interlayer insulating layer that are connected to the doping regions,
   wherein the interlayer insulating layer includes an organic layer, and the first contact hole and the second contact hole each include a first side wall positioned within the insulating layer opening.

2. The organic light emitting diode display of claim 1, wherein:
   the first contact hole and second contact hole further each include a second side wall which coincides with a side wall of the insulating layer opening or is positioned outside the insulating layer opening.

3. The organic light emitting diode display of claim 2, wherein:
   the first side wall is an end surface of the interlayer insulating layer, and
   the second side wall is an end surface of the gate insulating layer and the interlayer insulating layer.

4. An organic light emitting diode display, comprising:
   a substrate;
   a switching transistor on the substrate connected to a scan line and a data line;
   a driving transistor connected to the switching transistor;
   a compensation transistor that is connected to a driving drain electrode of the driving transistor and is turned on by the scan signal to compensate for a threshold voltage of the driving transistor;
   a first data connecting member that connects a compensation drain electrode of the compensation transistor and a driving gate electrode of the driving transistor; and
   a gate insulating layer and an interlayer insulating layer sequentially disposed on the substrate to cover the switching transistor and the compensation transistor,
   wherein one end of the first data connecting member is connected to the compensation drain electrode through a first contact hole,
   a switching source electrode of the switching transistor is connected to the data line through a second contact hole,
   a first side wall of each of the first contact hole and the second contact hole is an end surface of the interlayer insulating layer and is positioned within an insulating layer opening through the gate insulating layer which overlaps the compensation drain electrode and the switching source electrode simultaneously, and
   the first contact hole and second contact hole further include a second side wall defined by end surfaces of the gate insulating layer and interlayer insulating layer.

5. The organic light emitting diode display of claim 4, wherein
   the scan line is disposed on the substrate and transmits a scan signal;
   the data line intersects the scan line and transmits a data voltage; and further comprising
   a driving voltage line that intersects the scan line and transmits a driving voltage, and
   an organic light emitting diode electrically connected to the driving transistor.

6. The organic light emitting diode display of claim 4, further comprising:
   a second storage electrode positioned on the gate insulating layer that is connected to the driving voltage line and overlaps a first storage electrode,
   wherein the gate insulating layer includes a first gate insulating layer and a second gate insulating layer,
   the second storage electrode is positioned on the second gate insulating layer and has a storage opening which overlaps the second gate insulating layer,
   an other end of the first data connecting member is connected to the driving gate electrode through the storage opening,
   the scan line is disposed between the first gate insulating layer and the second gate insulating layer, and
   the first data connecting member is disposed on the interlayer insulating layer.

7. The organic light emitting diode display of claim 4, wherein:
   the organic light emitting diode includes:
   a first electrode electrically connected to the driving transistor;
   an organic emission layer formed on the first electrode, and
   a second electrode formed on the organic emission layer,
   wherein the first electrode is spaced apart from the first data connecting member on a plane.

8. The organic light emitting diode display of claim 7, further comprising:
   a passivation layer that covers the data line, driving voltage line, and first data connecting member;
   a pixel defined layer disposed on the passivation layer that covers an edge of the first electrode; and
   an initialization voltage line disposed on the same layer as the first electrode that transmits an initialization voltage to initialize the driving transistor.

* * * * *